United States Patent
Motwani et al.

(10) Patent No.: US 10,073,731 B2
(45) Date of Patent: Sep. 11, 2018

(54) ERROR CORRECTION IN MEMORY

(71) Applicant: Intel Corporation, Santa Clara, CA (US)

(72) Inventors: Ravi H. Motwani, San Diego, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/091,757

(22) Filed: Nov. 27, 2013

(65) Prior Publication Data

US 2015/0149857 A1    May 28, 2015

(51) Int. Cl.
| | |
|---|---|
| *G06F 11/10* | (2006.01) |
| *H03M 13/05* | (2006.01) |
| *H03M 13/11* | (2006.01) |
| *H03M 13/15* | (2006.01) |
| *H03M 13/23* | (2006.01) |
| *H03M 13/29* | (2006.01) |

(52) U.S. Cl.
CPC .......... *G06F 11/1008* (2013.01); *G06F 11/10* (2013.01); *G06F 11/1004* (2013.01); *G06F 11/1048* (2013.01); *H03M 13/05* (2013.01); *H03M 13/1102* (2013.01); *H03M 13/152* (2013.01); *H03M 13/1515* (2013.01); *H03M 13/23* (2013.01); *H03M 13/2957* (2013.01)

(58) Field of Classification Search
CPC ............. G06F 11/1008; G06F 11/1004; G06F 11/1048
USPC .................................................. 714/773, 780
See application file for complete search history.

(56) References Cited

U.S. PATENT DOCUMENTS

| | | | | |
|---|---|---|---|---|
| 5,241,546 A | * | 8/1993 | Peterson et al. | 714/761 |
| 5,559,956 A | * | 9/1996 | Sukegawa | G06F 12/0246 |
| | | | | 711/E12.014 |
| 5,761,220 A | * | 6/1998 | Zook | 714/764 |
| 6,943,973 B1 | * | 9/2005 | Nunomura et al. | 360/53 |
| 7,257,763 B1 | * | 8/2007 | Srinivasan et al. | 714/764 |
| 7,356,671 B1 | * | 4/2008 | Wei | G06F 9/3851 |
| | | | | 712/35 |
| 7,461,320 B2 | * | 12/2008 | Klein | G06F 11/1052 |
| | | | | 714/754 |
| 7,587,658 B1 | * | 9/2009 | Tong et al. | 714/785 |

(Continued)

FOREIGN PATENT DOCUMENTS

JP    2007-157304 A    6/2007

OTHER PUBLICATIONS

International Search Report and Written Opinion received for International Application No. PCT/US2014/061929, dated Jan. 21, 2015.

*Primary Examiner* — Joseph D Torres
(74) *Attorney, Agent, or Firm* — Thorpe North & Western, LLP

(57) ABSTRACT

Apparatus, systems, and methods for error correction in memory are described. In one embodiment, a controller comprises logic to receive a read request from a host device for data stored in a memory, retrieve the data and an associated error correction codeword, send the data to a host device, apply an error correction routine to decode the error correction codeword retrieved with the data, and in response to an error in the error correction codeword, send a location of data associated with the error to the host device. Other embodiments are also disclosed and claimed.

15 Claims, 8 Drawing Sheets

(56) References Cited

U.S. PATENT DOCUMENTS

| | | | |
|---|---|---|---|
| 7,774,684 B2* | 8/2010 | Bains | G06F 11/1008 |
| | | | 714/766 |
| 7,865,809 B1 | 1/2011 | Lee et al. | |
| 7,958,430 B1* | 6/2011 | Kolokowsky | G06F 11/1068 |
| | | | 714/763 |
| 2003/0041299 A1* | 2/2003 | Kanazawa | G06F 11/1072 |
| | | | 714/766 |
| 2003/0088805 A1* | 5/2003 | Majni et al. | 714/6 |
| 2004/0163027 A1* | 8/2004 | MacLaren | G06F 11/108 |
| | | | 714/764 |
| 2005/0041553 A1* | 2/2005 | Aizawa | 369/59.17 |
| 2007/0234182 A1* | 10/2007 | Wickeraad | G06F 11/1008 |
| | | | 714/763 |
| 2008/0052564 A1* | 2/2008 | Yim et al. | 714/699 |
| 2008/0222490 A1* | 9/2008 | Leung | G06F 11/1068 |
| | | | 714/763 |
| 2008/0222491 A1* | 9/2008 | Lee | G06F 11/1068 |
| | | | 714/763 |
| 2011/0041005 A1* | 2/2011 | Selinger | 714/6 |
| 2011/0041037 A1* | 2/2011 | Frost et al. | 714/763 |
| 2012/0159286 A1* | 6/2012 | Koshiyama | G06F 11/1048 |
| | | | 714/768 |
| 2012/0297271 A1 | 11/2012 | Sommer et al. | |
| 2012/0311193 A1 | 12/2012 | Erdmann et al. | |
| 2013/0007350 A1 | 1/2013 | D'Abreau et al. | |
| 2013/0166988 A1 | 6/2013 | Sharon et al. | |
| 2013/0268803 A1* | 10/2013 | Kong et al. | 714/6.11 |

\* cited by examiner

ERROR CORRECTION IN MEMORY

TECHNICAL FIELD

The present disclosure generally relates to the field of electronics. More particularly, some embodiments of the invention generally relate to error correction in memory for electronic devices.

BACKGROUND

Many electronic devices include memory systems that may be implemented using local, fast-access memory which is frequently embodied as a nonvolatile memory, e.g., flash memory or the like. Periodically, read errors may occur due to errors in the storage media (non-volatile memory) and/or errors in signal processing. Existing error correction techniques may contribute to increased read latency in memory systems, which impacts the overall performance of electronic devices. Accordingly, techniques to manage error correction in memory may find utility, e.g., in memory systems for electronic devices.

BRIEF DESCRIPTION OF THE DRAWINGS

The detailed description is provided with reference to the accompanying figures. The use of the same reference numbers in different figures indicates similar or identical items.

DESCRIPTION OF EMBODIMENTS

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Figure 1:
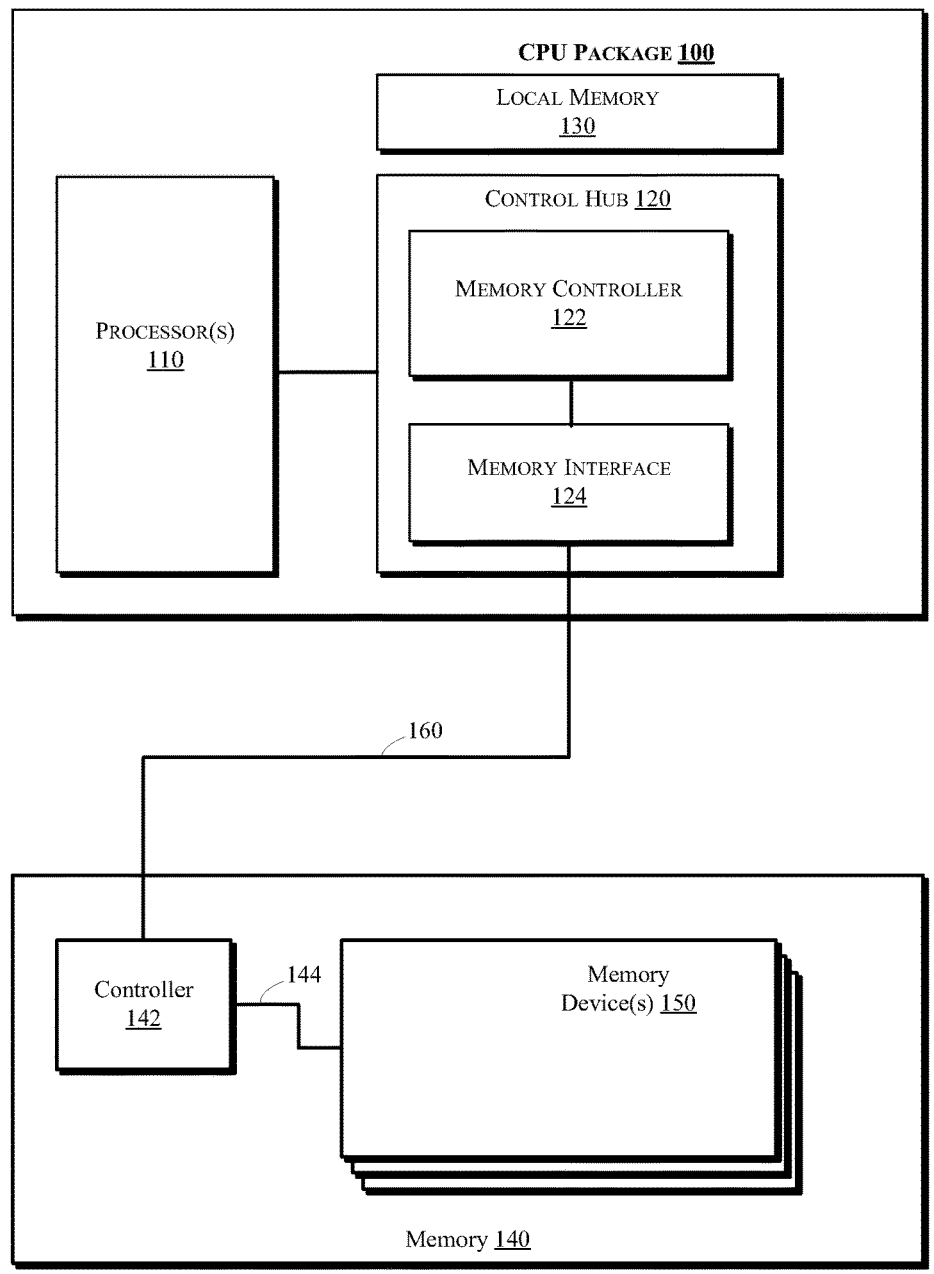
FIG. 1 is a schematic, block diagram illustration of components of apparatus to implement error correction in memory in accordance with various examples discussed herein.

FIG. 1 is a schematic, block diagram illustration of components of apparatus to implement error correction in memory in accordance with various examples discussed herein. Referring to FIG. 1, in some embodiments a central processing unit (CPU) package 100 which may comprise one or more processors 110 coupled to a control hub 120 and a local memory 130. Control hub 120 comprises a memory controller 122 and a memory interface 124.

Memory interface 124 is coupled to a remote memory 140 by a communication bus 160. In some examples, the communication bus 160 may be implemented as traces on a printed circuit board, a cable with copper wires, a fibre optic cable, a connecting socket, or a combination of the above. Memory 140 may comprise a controller 142 and one or more memory device(s) 150. In various embodiments, at least some of the memory banks 150 may be implemented using volatile memory, e.g., static random access memory (SRAM), a dynamic random access memory (DRAM), nonvolatile memory, or non-volatile memory, e.g., phase change memory, NAND (flash) memory, ferroelectric random-access memory (FeRAM), nanowire-based non-volatile memory, memory that incorporates memristor technology, three dimensional (3D) cross point memory such as phase change memory (PCM), spin-transfer torque memory (STT-RAM) or NAND flash memory. By way of example, in some embodiments the memory device(s) 140 may comprise one or more direct in-line memory modules (DIMMs) coupled to a memory channel 144 which provides a communication link to controller 142. The specific configuration of the memory device(s) 150 in the memory 140 is not critical.

As described above, in some embodiments logic in the memory controller 122 and the controller 142 implement error correction in memory 140. More particularly, in some embodiments the memory controller 122 and controller 142 implement low-latency error correction operations in memory 140.

A first technique to implement error correction in memory will be explained with reference to FIGS. 2-3. In a first technique data read from memory 140 in response to a read request from memory controller 122 is returned uncorrected to memory controller 122. Contemporaneously, controller 142 implements an ECC routine on the data read from memory 140. If the ECC routine indicates that there are no read errors in the data then the controller 142 sends a signal to the memory controller 122 indicating that the data is clean. By contrast, if the ECC routine indicates one or more errors in the data, then the controller 142 transmits the location of the error(s) in the data read from the memory 140 to the memory controller 122, which can correct the errors by flipping the erroneous bit(s) from a binary 1 to a binary zero, or vice versa.

Figure 2:
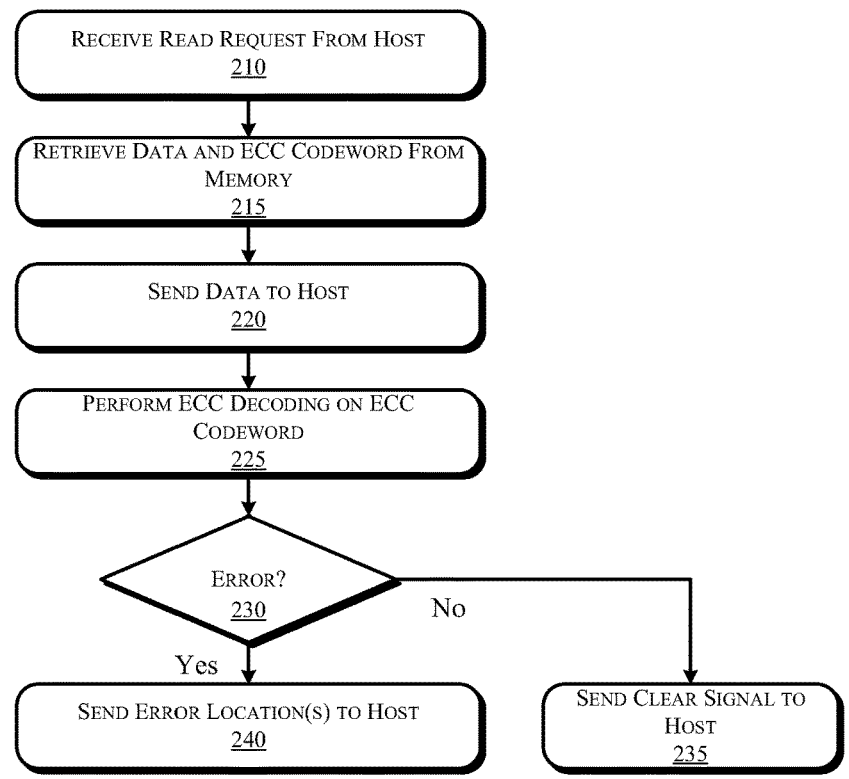
FIGS. 2-3 and 5 are flowcharts illustrating operations in a method to implement error correction in memory accordance with various embodiments discussed herein.

Referring to FIG. 2, at operation 210 the controller 142 receives a read request from a host device. By way of example, in the memory system configuration depicted in FIG. 1 the memory controller 122 may receive a read request for data in memory 140 from one or more applications executing on processor(s) 110. In response to the read request, memory controller 122 may transmit one or more read requests to controller 142 via memory interface 124. The read request(s) may request a specific block size, e.g., 256 bytes.

Controller 142 receives the read request at operation 210 and at operation 215 controller 142 retrieves data and an accompanying ECC codeword associated with the data from memory 140. At operation 220 the controller 142 sends the data retrieved from memory 140 to the host device, e.g., the memory controller 122. As described above, the data retrieved from memory 140 may be transmitted to the memory controller 122 before an ECC routine is completed.

At operation 225 the controller 142 performs an ECC decoding operation on the ECC codeword retrieved with the data. By way of example, the ECC codeword may be implemented as a Bose-Chaudhuri-Hocquenghem (BCH) error correction code, a Reed-Solomon code, a low-density parity check (LDPC) code, a turbo code, a convolutional code, a polar code, or the like. The ECC codeword may be decoded, e.g., by applying an XOR operation or the like.

If, at operation 230, the ECC decoding indicates that the data read from the memory 140 does not include errors then control passes to operation 235 and the controller 142 sends a clear signal to the memory controller 142. By contrast, if at operation 230 the ECC decoding indicates that there an error in the data, the control passes to operation 240 and the controller 142 sends the error location(s) to the host device. By way of example, in a 256 byte block, the controller 142 may send the locations in the block of bytes that are indicated as being erroneous.

Figure 3:
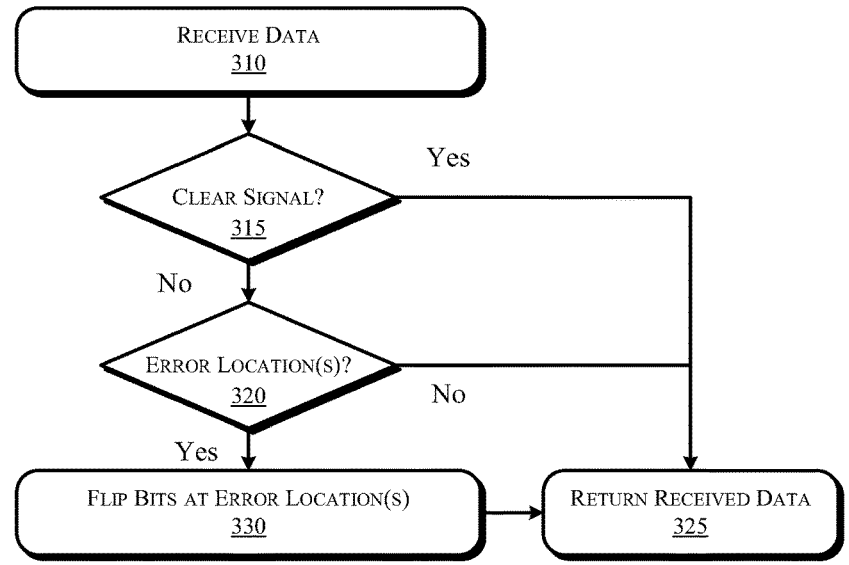

FIG. 3 depicts operations implemented by the host device, e.g., the memory controller 122, in response to data retrieved in a read operation. Referring to FIG. 3, at operation 310 the memory controller 122 receives a data block from the controller 142. As described above, the data may be returned from controller 142 before an ECC routine is applied to the data. Thus, the memory controller 122 may wait to receive a signal from the controller 122 before returning the read data to requesting application executing on processor(s) 110.

Thus, if at operation 315 the memory controller 122 receives a clear signal from the controller 122 indicating that the read data is error-free, then control passes to operation 325 and the memory controller 122 returns the received read data to the application executing on processor(s) 110.

By contrast, if at operation 315 the memory controller 122 did not receive a clear signal then control passes to operation 320. If, at operation 320, the memory controller 122 receives a message from controller 142 indicating the locations of errors in the read data then control passes to operation 330 and the memory controller flips the bits in the error location(s) in the read data. For example, if a particular bit in the read data is indicated as erroneous then the memory controller 122 flips the bit from a zero (0) to a one (1), or vice versa, in order to correct the read error(s). Once the errors have been corrected then the corrected data may be returned to the application executing on processor(s) 110.

Thus the operations depicted in FIGS. 2-3 enable the controller 142 to implement a low-latency ECC procedure by forwarding uncorrected read data to the memory controller 142, then subsequently transmitting either a clear signal or a signal which includes the location(s) of read errors in the data. The memory controller 122 may then correct any errors, if necessary, and then forward the data to the requesting application. Because read errors are relatively rare, most read operations will result in a clear signal from the controller 142, such that the memory controller 122 can forward the data without error correction.

A second technique to implement error correction in memory will be explained with reference to FIGS. 4-5. In a second technique a data block in memory 140 may be subdivided into multiple chunks. A separate ECC codeword may be associated with each chunk, and a global ECC codeword may be associated with the entire data block. Data chunks read from memory 140 in response to a read request from memory controller 122 are retuned uncorrected to memory controller 122. Contemporaneously, controller 142 implements an ECC routine on the data chunks read from memory 140. If the ECC routine indicates that there are no read errors in the data chunks then the controller 142 sends a signal to the memory controller 142 indicating that the data is clean. By contrast, if the ECC routine indicates one or more errors in the data chunks, then the controller 142 transmits the location of the error(s) in the data chunks read from the memory 140 to the memory controller 142, which can correct the errors by flipping the erroneous bit(s) from a binary 1 to a binary zero, or vice versa. Additionally, the controller 142 implements an ECC routine on the ECC codeword associated with the entire data block. If the ECC routine indicates errors then the data chunk(s) which contain the errors may be retransmitted to the memory controller 122.

Figure 4:
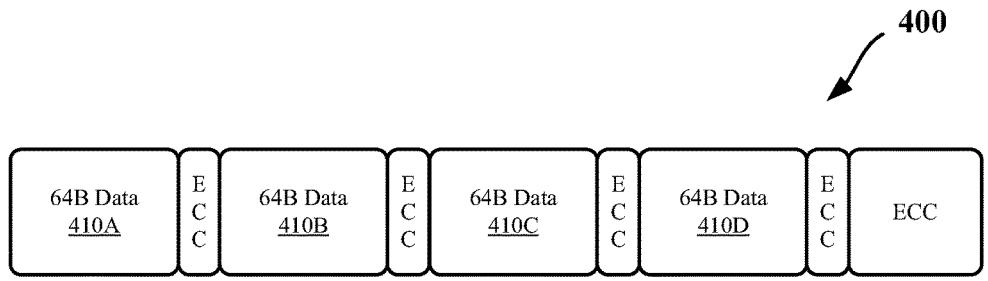
FIG. 4 is a schematic illustration of a data block which may be used in a method to implement error correction in memory accordance with various embodiments discussed herein.

Referring to FIG. 4, in some embodiments a 256 byte data block 400 in memory 140 may be broken into four 64 byte data chunks 410A, 410B, 410C, 410D, which may be referred to collectively by reference numeral 410. Each data chunk 410 may have an ECC code 412A, 412B, 412C, 412D, which may be referred to collectively by reference numeral 412, associated therewith. Further, a block ECC code 414 may be associated with the entire data block 400.

Figure 5:
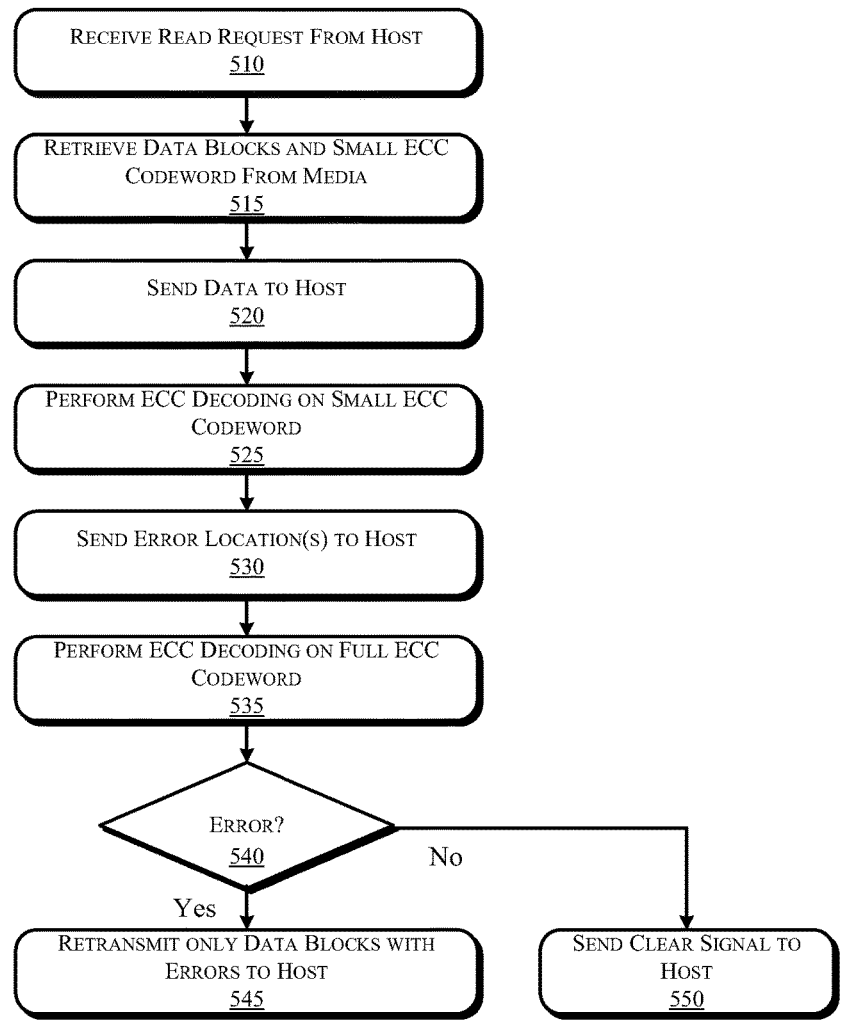

Referring now to FIG. 5, at operation 510 the controller 142 receives a read request from a host device. By way of example, in the memory system configuration depicted in FIG. 1 the memory controller 122 may receive a read request for data in memory 140 from one or more applications executing on processor(s) 110. In response to the read request memory controller 122 may transmit one or more read requests to controller 142 via memory interface 124. The read request(s) may request a specific block size, e.g., 64 bytes.

Controller 142 receives the read request at operation 510 and at operation 515, controller 142 retrieves one or more data chunks 410 and the accompanying ECC codeword 412 associated with the data chunks 410 from memory 140. At operation 520 the controller 142 sends the data chunks retrieved from memory 140 to the host device, e.g., the memory controller 122. As described above, the data retrieved from memory 140 may be transmitted to the controller 122 before an ECC routine is completed.

At operation 525 the controller 142 performs an ECC decoding operation on the ECC codewords 412 retrieved with the data chunks 410. By way of example, the ECC codeword may be implemented as a Bose-Chaudhuri-Hocquenghem (BCH) error correction code, a Reed-Solomon code, a low-density parity check (LDPC) code, a turbo code, a convolutional code, a polar code, or the like. The ECC codeword may be decoded, e.g., by applying an XOR operation or the like.

At operation 530 the controller 142 sends any error locations detected from the ECC operation on the ECC codewords 412 to the memory controller 122. At operation 535 the controller 142 performs an ECC decoding operation on the ECC codeword 414. If, at operation 540, the ECC decoding indicates that the data read from the memory 140 does not include errors then control passes to operation 550 and the controller 142 sends a clear signal to the memory controller 142. By contrast, if at operation 540 the ECC decoding indicates that there an error in the data, the control passes to operation 545 and the controller 142 retransmits only the data chunks which include erroneous data to the host device. Memory controller 122 may implement operations analogous to those described in FIG. 3 to process the data received from the controller 142.

Figure 6:
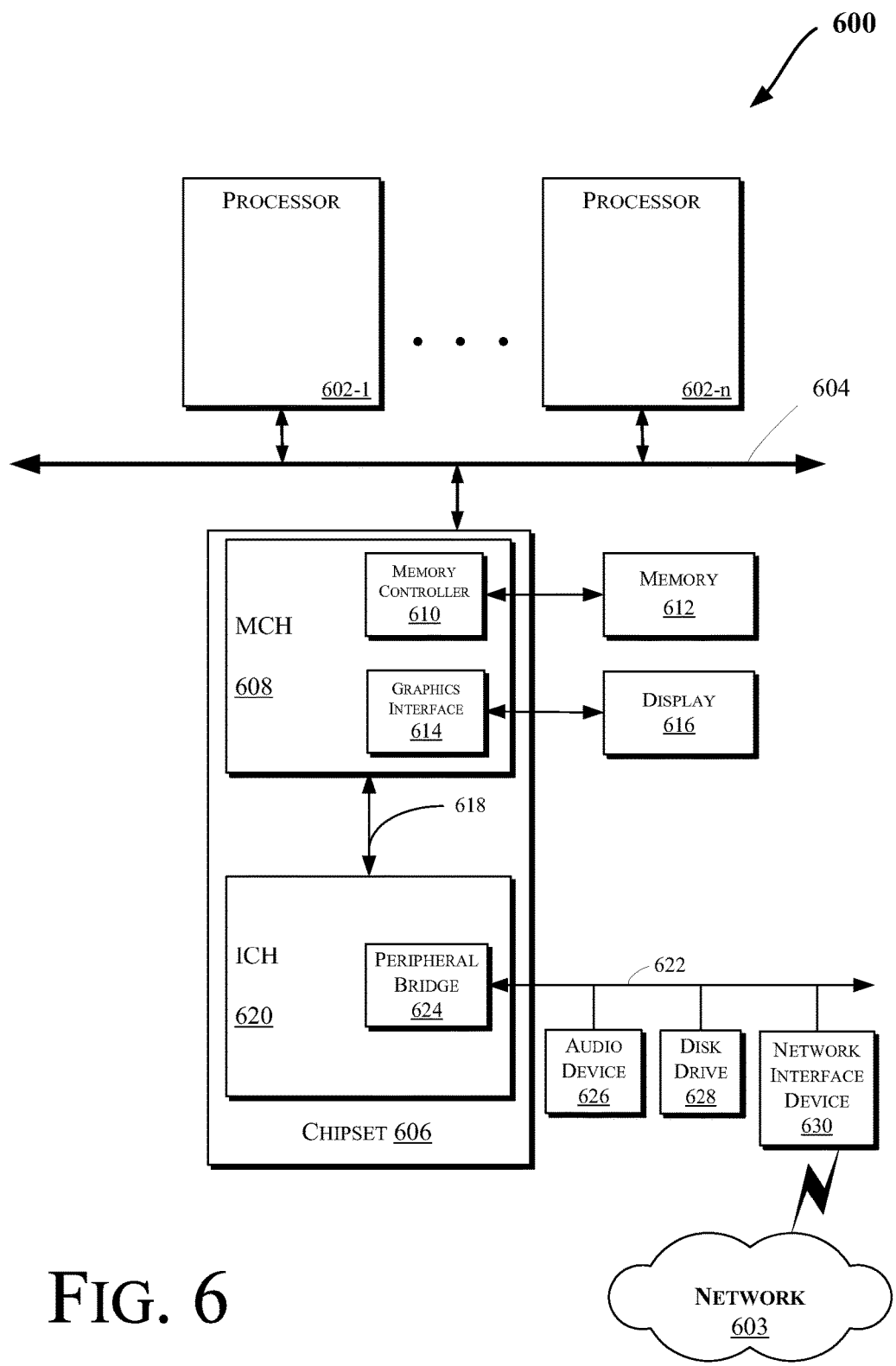
FIGS. 6-10 are schematic, block diagram illustrations of electronic devices which may be adapted to implement memory latency management in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk or a solid state drive (SSD). Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
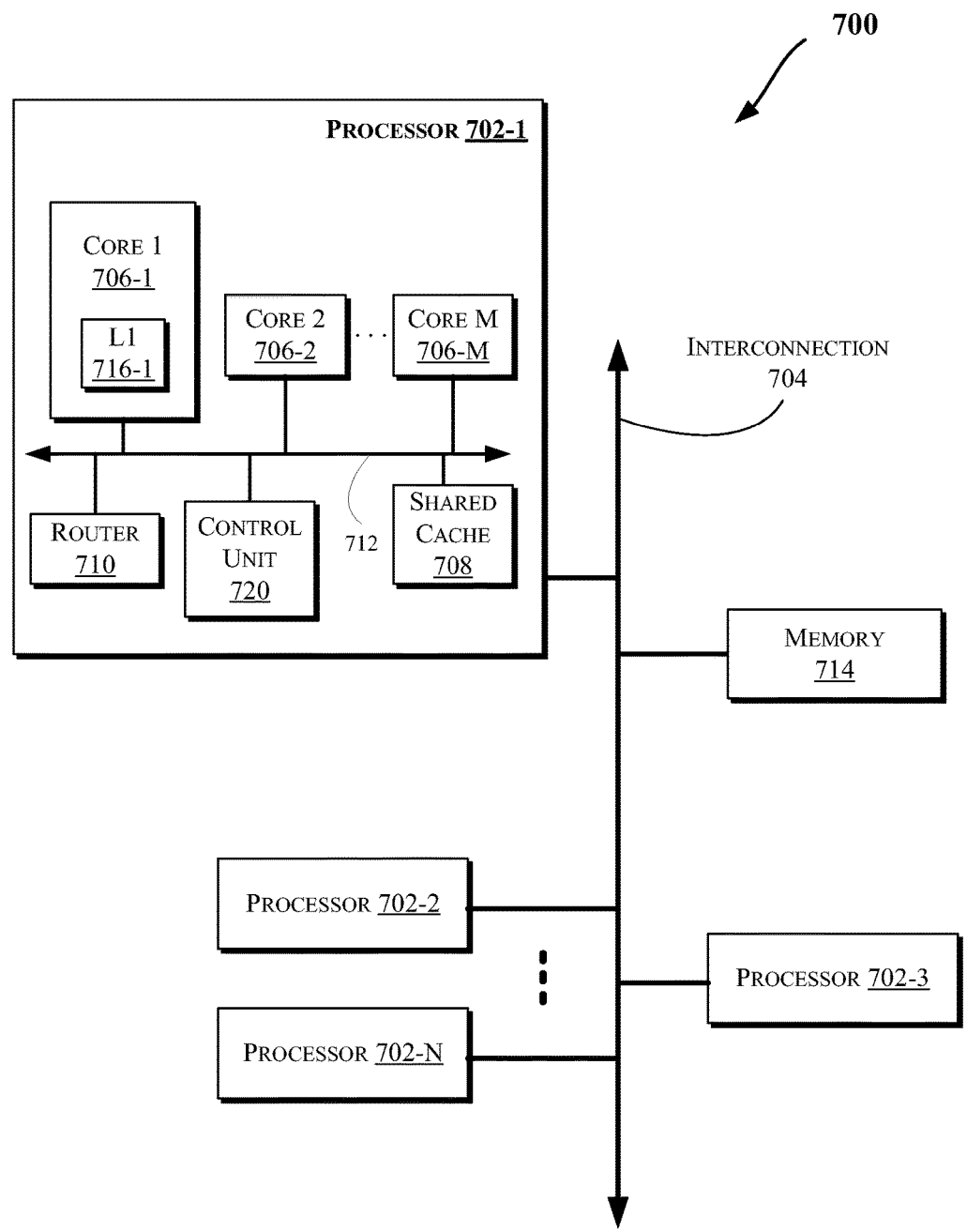

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the control unit 720 may include logic to implement the operations described above with reference to the memory controller 122 in FIG. 2.

Figure 8:
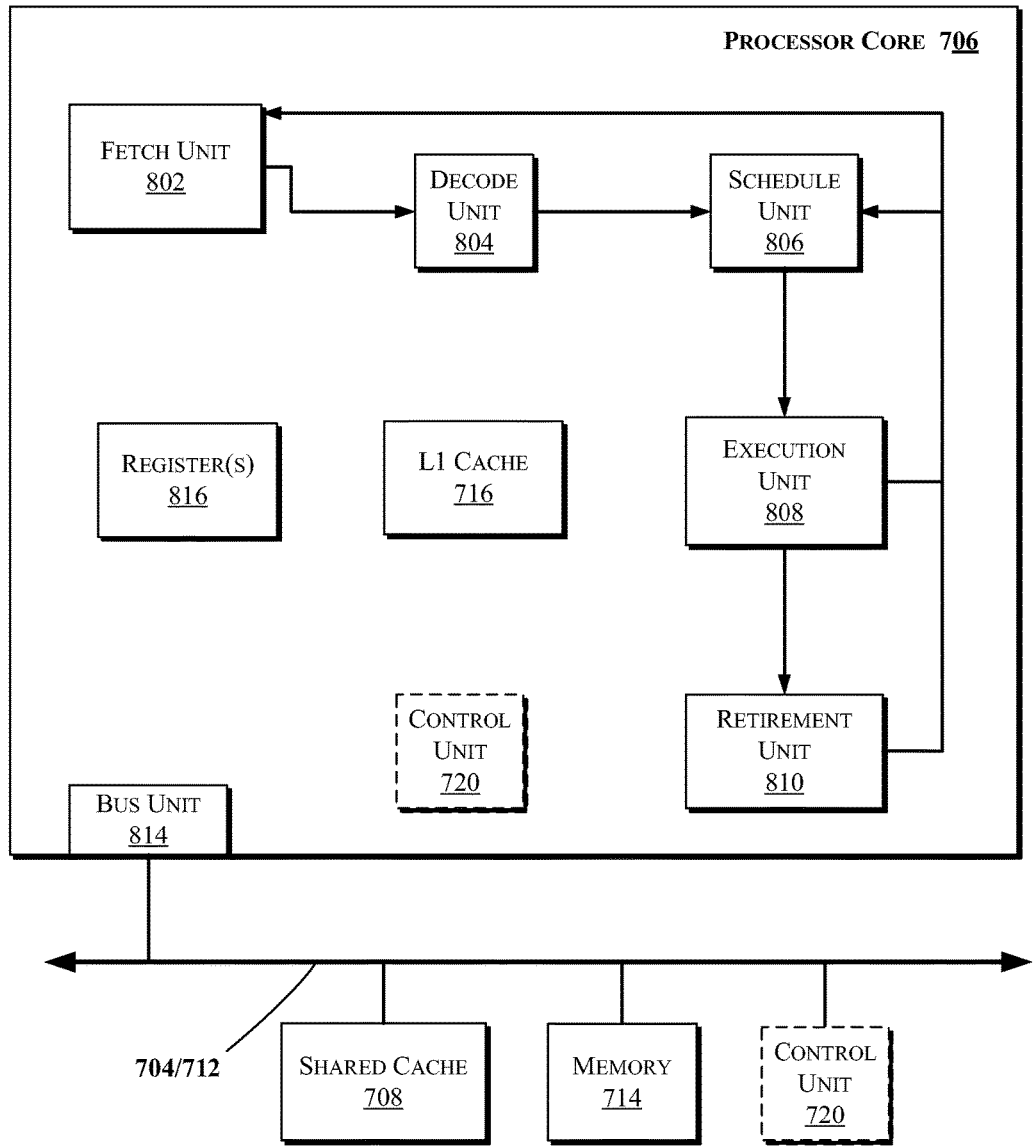

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
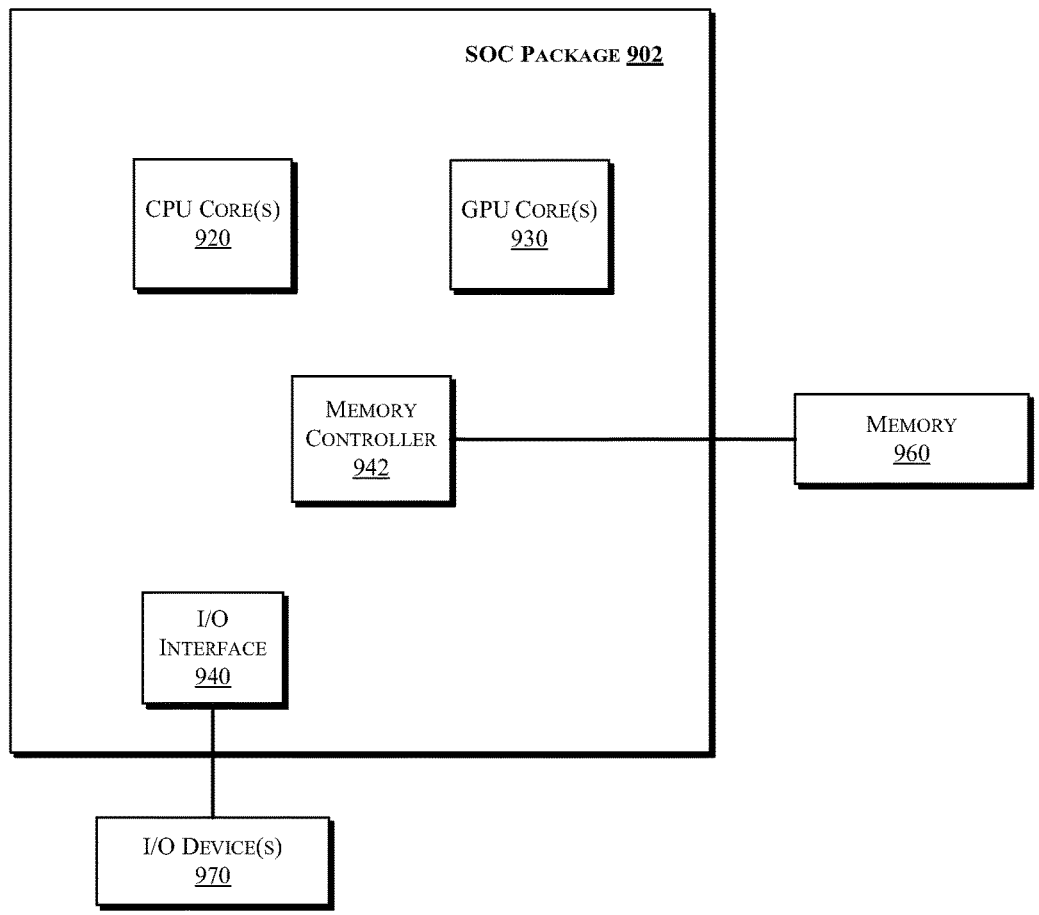

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
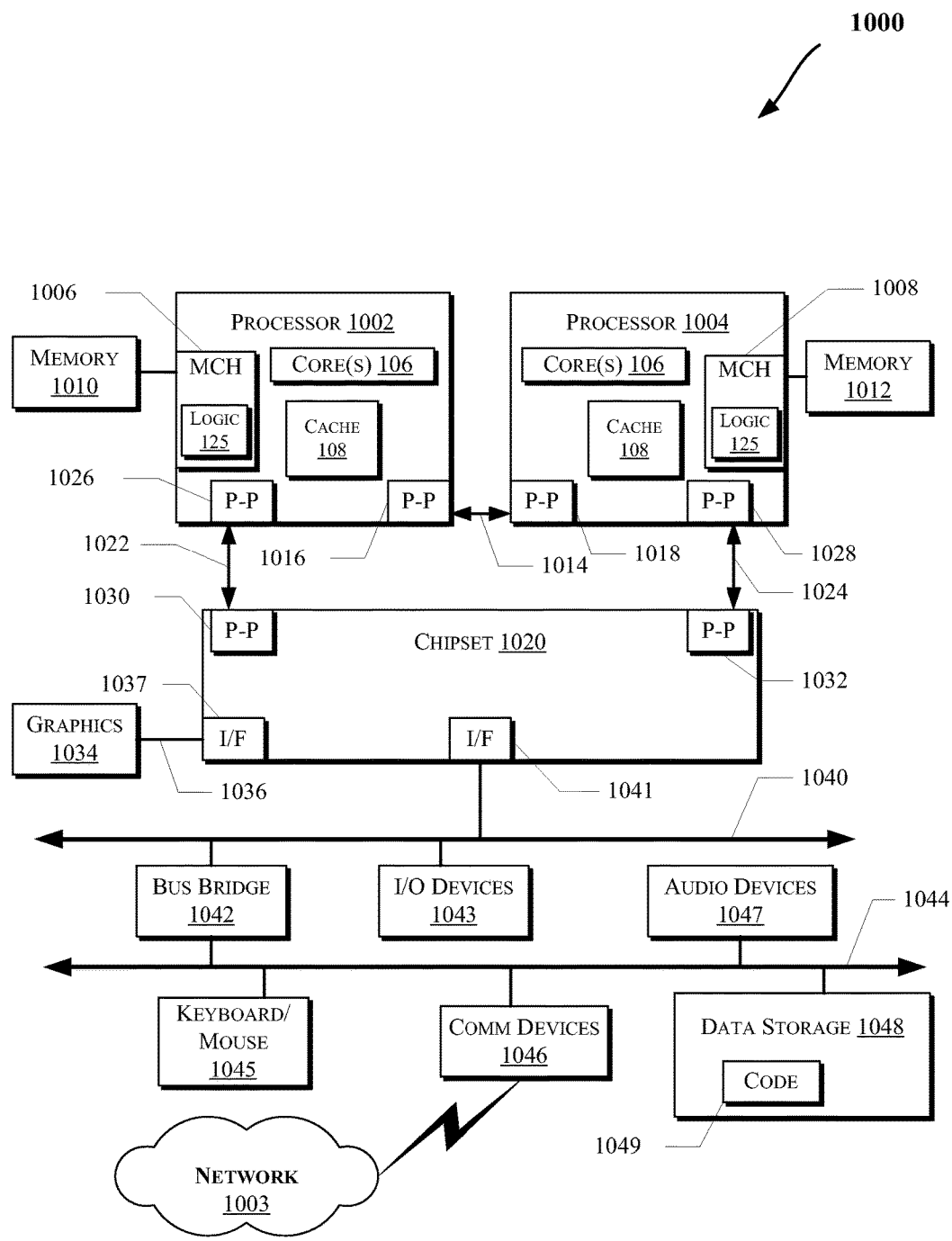

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 902 and 904. Other embodiments of the invention, however, may exist in other circuits, logic units, or devices within the system 900 of FIG. 9. Furthermore, other embodiments of the invention may be distributed throughout several circuits, logic units, or devices illustrated in FIG. 9.

The chipset 920 may communicate with a bus 940 using a PtP interface circuit 941. The bus 940 may have one or more devices that communicate with it, such as a bus bridge 942 and I/O devices 943. Via a bus 944, the bus bridge 943 may communicate with other devices such as a keyboard/mouse 945, communication devices 946 (such as modems, network interface devices, or other communication devices that may communicate with the computer network 803), audio I/O device, and/or a data storage device 948. The data storage device 948 (which may be a hard disk drive or a NAND flash based solid state drive) may store code 949 that may be executed by the processors 902 and/or 904.

The following examples pertain to further embodiments.

Example 1 is a memory, comprising a memory device and a controller coupled to the memory device and comprising logic to receive a read request from a host device for data stored in a memory, retrieve the data and an associated error correction codeword, send the data to a host device, apply an error correction routine to decode the error correction codeword retrieved with the data, and in response to an error in the error correction codeword, send a location of data associated with the error to the host device.

In Example 2, the subject matter of Example 1 can optionally include an arrangement in which the error correction codeword is a Bose-Chaudhuri-Hocquenghem (BCH) error correction code, and the ECC routine comprises performing a bitwise XOR of the data retrieved from memory.

In Example 3, the subject matter of any one of Examples 1-2 can optionally include an arrangement in which the data is sent to the host device before the error correction routine is applied to the codeword.

In Example 4, the subject matter of any one of Examples 1-3 can optionally include logic to send a clear signal to the host device when the error correction routine indicates that there are no errors in the data.

Example 5 is an electronic device comprising a processor and a memory, comprising a memory device, and a controller coupled to the memory device and comprising logic to receive a read request from a host device for data stored in a memory, retrieve the data and an associated error correction codeword, send the data to a host device, apply an error correction routine to decode the error correction codeword retrieved with the data, and in response to an error in the error correction codeword, send a location of data associated with the error to the host device.

In Example 6, the subject matter of any one of Examples 1-5 can optionally include an arrangement in which the error correction codeword is a Bose-Chaudhuri-Hocquenghem (BCH) error correction code, and the ECC routine comprises performing a bitwise XOR of the data retrieved from memory.

In Example 7, the subject matter of any one of Examples 5-6 can optionally include an arrangement in which the data is sent to the host device before the error correction routine is applied to the codeword.

In Example 8, the subject matter of any one of Examples 5-7 can optionally include logic to send a clear signal to the host device when the error correction routine indicates that there are no errors in the data.

In Example 9, the subject matter of any one of Examples 5-8 can optionally include logic to receive data from the controller, receive a clear signal from the controller, and in response to the clear signal, to return the data to a requestor.

In Example 10, the subject matter of any one of Examples 5-8 can optionally include logic to receive data from the controller, and receive a error location from the controller, and in response to the error location, to flip a bit value at the error location.

Example 11 is a method comprising receiving, in a controller, a read request for data stored in a memory, retrieving the data and an associated error correction codeword from the memory, sending the data to a host device, applying an error correction routine to decode the error correction codeword retrieved with the data, and in response to an error in the error correction codeword, sending a location of data associated with the error to the host device.

In Example 12, the subject matter of Example 11 can optionally include an arrangement in which the error correction codeword is a Bose-Chaudhuri-Hocquenghem (BCH) error correction code, and the ECC routine comprises performing a bitwise XOR of the data retrieved from memory.

In Example 13, the subject matter of any one of Examples 11-12 can optionally include an arrangement in which the data is sent to the host device before the error correction routine is applied to the codeword.

In Example 14, the subject matter of any one of Examples 11-13 can optionally include sending a clear signal to the host device when the error correction routine indicates that there are no errors in the data.

In Example 15, the subject matter of any one of Examples 11-14 can optionally include receiving, in a memory controller, data from the controller, and receiving, in the memory controller, a clear signal from the controller, and in response to the clear signal, returning the data to a requestor.

In Example 16, the subject matter of any one of Examples 11-15 can optionally include receiving, in a memory controller, data from the controller, and receiving, in the memory controller, an error location from the controller, and in response to the error location, flipping a bit value at the error location.

Example 17 is a memory, comprising a memory device and a controller coupled to the memory device and comprising logic to receive a read request from a host device for data stored in a memory, wherein the data is stored in a plurality of chunks, and each chunk has an associated error correction code, retrieve at least one chunk and an associated error correction codeword, send the chunk to a host device, apply an error correction routine to decode the error correction codeword retrieved with the chunk, and in response to an error in the error correction codeword, send a location of data associated with the error to the host device.

In example 18, the subject matter of Example 17 can optionally include an arrangement in which the error correction codeword is a Bose-Chaudhuri-Hocquenghem (BCH) error correction code, and the ECC routine comprises performing a bitwise XOR of the data retrieved from memory.

In Example 19, the subject matter of any one of Examples 17-18 can optionally include an arrangement in which the chunk is sent to the host device before the error correction routine is applied to the codeword.

In Example 20, the subject matter of any one of Examples 17-19 can optionally include an arrangement in which the data is stored with an associated block error correction code the controller further comprises logic to send a clear signal to the host device when the error correction routine indicates that there are no errors in the data.

In Example 21, the subject matter of any one of Examples 17-20 can optionally include an arrangement in which the data is stored with an associated block error correction code the controller further comprises logic to re-send a data chunk to the host device when the error correction routine indicates that there are errors in the data chunk.

Example 22 is an electronic device, comprising a processor and memory, comprising memory device and a controller coupled to the memory device and comprising logic to receive a read request from a host device for data stored in a memory, wherein the data is stored in a plurality of chunks, and each chunk has an associated error correction code, retrieve at least one chunk and an associated error correction codeword, send the chunk to a host device, apply an error correction routine to decode the error correction codeword retrieved with the chunk, and in response to an error in the error correction codeword, send a location of data associated with the error to the host device.

In example 23, the subject matter of Example 22 can optionally include an arrangement in which the error correction codeword is a Bose-Chaudhuri-Hocquenghem (BCH) error correction code, and the ECC routine comprises performing a bitwise XOR of the data retrieved from memory.

In Example 24, the subject matter of any one of Examples 22-23 can optionally include an arrangement in which the chunk is sent to the host device before the error correction routine is applied to the codeword.

In Example 25, the subject matter of any one of Examples 22-24 can optionally include an arrangement in which the data is stored with an associated block error correction code the controller further comprises logic to send a clear signal to the host device when the error correction routine indicates that there are no errors in the data.

In Example 26, the subject matter of any one of Examples 22-25 can optionally include an arrangement in which the data is stored with an associated block error correction code the controller further comprises logic to re-send a data chunk to the host device when the error correction routine indicates that there are errors in the data chunk.

In Example 27, the subject matter of any one of Examples 22-26 can optionally include a memory controller coupled to the processor and comprising logic to receive, in a memory controller, data from the controller, and receive, in the memory controller, a clear signal from the controller, and in response to the clear signal, returning the data to a requestor.

In Example 28, the subject matter of any one of Examples 22-27 can optionally include a memory controller coupled to the processor and comprising logic to receive data from the controller, and receive a error location from the controller, and in response to the error location, to flip a bit value at the error location.

Example 29 is a method, comprising receiving, in a controller, a read request from a host device for data stored in a memory, wherein the data is stored in a plurality of chunks, and each chunk has an associated error correction code, retrieving, from the memory, at least one chunk and an associated error correction codeword, sending the chunk to a host device, applying an error correction routine to decode the error correction codeword retrieved with the chunk, and in response to an error in the error correction codeword, sending a location of data associated with the error to the host device.

In example 30, the subject matter of Example 29 can optionally include an arrangement in which the error correction codeword is a Bose-Chaudhuri-Hocquenghem (BCH) error correction code, and the ECC routine comprises performing a bitwise XOR of the data retrieved from memory.

In Example 31, the subject matter of any one of Examples 29-30 can optionally include an arrangement in which the chunk is sent to the host device before the error correction routine is applied to the codeword.

In Example 32, the subject matter of any one of Examples 29-31 can optionally include an arrangement in which the data is stored with an associated block error correction code the controller further comprises logic to send a clear signal to the host device when the error correction routine indicates that there are no errors in the data.

In Example 33, the subject matter of any one of Examples 29-32 can optionally include an arrangement in which the data is stored with an associated block error correction code the controller further comprises logic to re-send a data chunk to the host device when the error correction routine indicates that there are errors in the data chunk.

In Example 34, the subject matter of any one of Examples 29-33 can optionally include a memory controller coupled to the processor and comprising logic to receive, in a memory controller, data from the controller, and receive, in the memory controller, a clear signal from the controller, and in response to the clear signal, returning the data to a requestor.

In Example 35, the subject matter of any one of Examples 29-34 can optionally include a memory controller coupled to the processor and comprising logic to receive data from the controller, and receive a error location from the controller, and in response to the error location, to flip a bit value at the error location.

In various embodiments of the invention, the operations discussed herein, e.g., with reference to FIGS. 1-10, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:
1. An apparatus, comprising:
 a memory device; and
 a second memory controller communicatively coupled between the memory device and a first memory controller located at a host system and comprising logic to:
  receive a read request from the first memory controller for data stored in the memory device;
  retrieve the data and an associated error correction codeword from the memory device;

send the data to the first memory controller at the host system prior to applying an error detection and correction routine;

apply the error detection and correction routine to decode the error correction codeword retrieved with the data; and in response to detecting an error in the error correction codeword, send a location of data associated with the error to the first memory controller.

2. The apparatus of claim 1, wherein:

the error correction codeword is a Bose-Chaudhuri-Hocquenghem (BCH) error correction code; and the error detection and correction routine comprises performing a bitwise XOR of the data retrieved from the memory device.

3. The apparatus of claim 1, wherein the second memory controller further comprises logic to:

send a clear signal to the first memory controller when the error detection and correction routine indicates that there are no errors in the data.

4. The apparatus of claim 1, wherein the second memory controller is coupled at the memory device and the first memory controller is separately coupled to a central processing unit package.

5. The apparatus of claim 4, wherein the first memory controller is integrated into the central processing unit package.

6. An electronic device, comprising:

a processor; and an apparatus, comprising:

a memory device; and a second memory controller communicatively coupled between the memory device and a first memory controller located at a host system, and comprising logic to:

receive a read request from the first memory controller for data stored in the memory device;

retrieve the data and an associated error correction codeword from the memory device;

send the data to the first memory controller at the host system prior to applying an error detection and correction routine;

apply the error detection and correction routine to decode the error correction codeword retrieved with the data; and in response to detecting an error in the error correction codeword, send a location of data associated with the error to the first memory controller.

7. The electronic device of claim 6, wherein:

the error correction codeword is a Bose-Chaudhuri-Hocquenghem (BCH) error correction code; and the error detection and correction routine comprises performing a bitwise XOR of the data retrieved from the memory device.

8. The electronic device of claim 6, wherein the second memory controller further comprises logic to:

send a clear signal to the first memory controller when the error detection and correction routine indicates that there are no errors in the data.

9. The electronic device of claim 6, wherein the first memory controller is coupled to the processor and comprises logic to:

receive data from the second memory controller;

receive a clear signal from the second memory controller; and return the data to a requestor in response to the clear signal.

10. The electronic device of claim 6, wherein the first memory controller is coupled to the processor and comprises logic to:

receive data from the second memory controller;

receive the location in the data of the error from the second memory controller; and flip a bit value at the location in the data of the error.

11. A method, comprising:

receiving, in a second memory controller, a read request from a first memory controller at a host system communicatively coupled to the second memory controller for data stored in a memory device communicatively coupled to the second memory controller;

retrieving, by the second memory controller, the data and an associated error correction codeword from the memory device;

sending, from the second memory controller, the data to the first memory controller at the host system prior to applying an error detection and correction routine;

applying, in the second memory controller, the error detection and correction routine to decode the error correction codeword retrieved with the data; and in response to detecting an error in the error correction codeword, sending a location of data associated with the error from the second memory controller to the first memory controller.

12. The method of claim 11, wherein:

the error correction codeword is a Bose-Chaudhuri-Hocquenghem (BCH) error correction code; and the error detection and correction routine comprises performing a bitwise XOR of the data retrieved from the memory device.

13. The method of claim 11, further comprising:

sending, as a signal from the second memory controller, a clear signal to the first memory controller when the error detection and correction routine indicates that there are no errors in the data.

14. The method of claim 13, further comprising:

receiving, in the first memory controller, data from the second memory controller;

receiving, in the first memory controller, the signal as a clear signal from the second memory controller, and in response to the clear signal, returning the data to a requestor.

15. The method of claim 13, further comprising:

receiving, in the first memory controller, data from the second memory controller;

receiving, in the first memory controller, the location in the data of the error from the second memory controller; and flipping a bit value at the location in the data of the error.

* * * * *